(12) United States Patent
Feng

(10) Patent No.: US 12,200,884 B2
(45) Date of Patent: Jan. 14, 2025

(54) DISPLAY DEVICE COMPRISING REAR SHELL, SUPPORT PLATE, AND DISPLAY SCREEN COOPERATING WITH EACH OTHER

(71) Applicant: WUHAN CHINA STAR OPTOELECTRONICS SEMICONDUCTOR DISPLAY TECHNOLOGY CO., LTD., Wuhan (CN)

(72) Inventor: Zikang Feng, Wuhan (CN)

(73) Assignee: WUHAN CHINA STAR OPTOELECTRONICS SEMICONDUCTOR DISPLAY TECHNOLOGY CO., LTD., Wuhan (CN)

(*) Notice: Subject to any disclaimer, the term of this patent is extended or adjusted under 35 U.S.C. 154(b) by 796 days.

(21) Appl. No.: 16/966,087

(22) PCT Filed: Apr. 14, 2020

(86) PCT No.: PCT/CN2020/084584
§ 371 (c)(1),
(2) Date: Jul. 30, 2020

(87) PCT Pub. No.: WO2021/120463
PCT Pub. Date: Jun. 24, 2021

(65) Prior Publication Data
US 2023/0156940 A1    May 18, 2023

(30) Foreign Application Priority Data
Dec. 19, 2019  (CN) .......................... 201911318780.3

(51) Int. Cl.
*H05K 5/02*     (2006.01)

(52) U.S. Cl.
CPC ................................. *H05K 5/0226* (2013.01)

(58) Field of Classification Search
CPC .... H05K 5/0226; G06F 1/1652; G06F 1/1681
See application file for complete search history.

(56) References Cited

U.S. PATENT DOCUMENTS 9,173,288 B1 *  10/2015  Kim ....................... G06F 1/1681
10,268,237 B2 *  4/2019  Lin ........................... E05F 5/06
(Continued)

FOREIGN PATENT DOCUMENTS

CN    105549689 A    5/2016
CN    106205385 A    12/2016
(Continued)

*Primary Examiner* — Rockshana D Chowdhury
*Assistant Examiner* — Douglas R Burtner
(74) *Attorney, Agent, or Firm* — PV IP PC; Wei Te Chung

(57) ABSTRACT

A display device is provided. The display device includes a rear shell. The rear shell includes a first rear shell; a second rear shell; a third rear shell, wherein two ends of the third rear shell are respectively rotatably connected to the first rear shell and the second rear shell; a support plate including a first support plate, wherein the first support plate is disposed on the first rear shell, an end of the first support plate is rotatably connected to the third rear shell, and another end of the first support plate is slidingly connected to the first rear shell; a second support plate, wherein the second support plate is disposed on the second rear shell, an end of the second support plate is rotatably connected to the third rear shell, and another end of the second support plate is slidingly connected to the second rear shell.

14 Claims, 4 Drawing Sheets

(56) References Cited

U.S. PATENT DOCUMENTS

| | | | |
|---|---|---|---|
| 10,423,019 B1* | 9/2019 | Song | G06F 1/1641 |
| 10,599,189 B1 | 3/2020 | Hsu et al. | |
| 2013/0002114 A1* | 1/2013 | Hamers | G06F 1/1681 |
| | | | 312/326 |
| 2015/0366089 A1* | 12/2015 | Park | H04M 1/0268 |
| | | | 361/679.01 |
| 2015/0378397 A1* | 12/2015 | Park | G06F 1/1656 |
| | | | 361/679.27 |
| 2016/0070306 A1* | 3/2016 | Shin | H04M 1/0268 |
| | | | 361/679.27 |
| 2016/0295709 A1* | 10/2016 | Ahn | G06F 1/1652 |
| 2018/0284839 A1* | 10/2018 | Lin | G06F 1/1681 |
| 2019/0179373 A1* | 6/2019 | Cheng | H04M 1/0216 |
| 2019/0208649 A1* | 7/2019 | Jeon | H05K 5/0217 |
| 2020/0267851 A1 | 8/2020 | Hou et al. | |
| 2020/0341523 A1 | 10/2020 | Chen | |
| 2020/0363843 A1* | 11/2020 | Cheng | H04M 1/02 |
| 2022/0417351 A1* | 12/2022 | Nam | H04M 1/022 |

FOREIGN PATENT DOCUMENTS

| | | |
|---|---|---|
| CN | 107358874 A | 11/2017 |
| CN | 107731100 A | 2/2018 |
| CN | 207543155 U | 6/2018 |
| CN | 108520701 A | 9/2018 |
| CN | 109194782 A | 1/2019 |
| CN | 208353382 U | 1/2019 |
| CN | 208673636 U | 3/2019 |
| CN | 208689845 U | 4/2019 |
| CN | 109780403 A | 5/2019 |
| CN | 110005695 A | 7/2019 |
| CN | 110570769 A | 12/2019 |
| KR | 20160118407 A | 10/2016 |
| KR | 20190065641 A | 6/2019 |
| TW | 201921220 A | 6/2019 |

* cited by examiner

DISPLAY DEVICE COMPRISING REAR SHELL, SUPPORT PLATE, AND DISPLAY SCREEN COOPERATING WITH EACH OTHER

FIELD OF INVENTION

The present invention relates to the field of display technologies, and more particularly to a display device.

BACKGROUND OF INVENTION

With the development of mobile terminals, mobile terminals with large screens are more and more popular.

However, as the screen of the mobile terminal becomes larger, its portability also decreases. Therefore, it is necessary to provide a portable display device with a large screen.

SUMMARY OF INVENTION

An object of the present invention is to provide a display device which can improve portability of the display device.

An embodiment of the present invention provides a display device comprising a rear shell. The rear shell comprises a first rear shell; a second rear shell; a third rear shell, wherein two ends of the third rear shell are respectively rotatably connected to the first rear shell and the second rear shell; a support plate comprising a first support plate, wherein the first support plate is disposed on the first rear shell, an end of the first support plate is rotatably connected to the third rear shell, and another end of the first support plate is slidingly connected to the first rear shell; a second support plate, wherein the second support plate is disposed on the second rear shell, an end of the second support plate is rotatably connected to the third rear shell, and another end of the second support plate is slidingly connected to the second rear shell. When the first rear shell, the second rear shell, and the third rear shell are on a same horizontal plane, the first rear shell and the second rear shell completely house the third rear shell. A corner of a first side of the first rear shell close to the second rear shell is rounded, and a corner of a second side of the second rear shell close to the first rear shell is rounded.

In an embodiment of the present invention, the display device further comprises a plurality of rotating shafts. The first rear shell comprises a first bottom surface and two first side surfaces respectively connected to the first bottom surface, the two first side surfaces are oppositely arranged, and each of the first side surfaces is provided with a first through hole. The second rear shell comprises a second bottom surface and two second side surfaces respectively connected to the second bottom surface, the two second side surfaces are oppositely arranged, and each of the second side surfaces is provided with a second through hole. The third rear shell comprises a third bottom surface and two third side surfaces respectively connected to the third bottom surface, the two third side surfaces are oppositely arranged, an end of each of the third side surfaces is provided with a third through hole, another end of each of the third sides is provided with a fourth through hole. The first through hole and the third through hole are fixed together by a corresponding rotating shaft, and the second through hole and the fourth through hole are fixed together by a corresponding rotating shaft.

In an embodiment of the present invention, each first side of the first rear shell is provided with a first chute, each second side of the second rear shell is provided with a second chute, each of two sides of the first support plate is provided with a first slider, and the first slider is inserted in a corresponding first chute, so that an end of the first support plate is slidingly connected to the first rear shell, each of two sides of the second support plate is provided with a second slider, and the second slider is inserted in a corresponding second chute, so that an end of the second support plate is slidingly connected to the second rear shell.

In an embodiment of the present invention, the first chute and the second chute are both linear chutes, or the first chute and the second chute are both arc-shaped chutes.

In an embodiment of the present invention, each third side of the third rear shell is provided with a first rotating shaft groove and a second rotating shaft groove, each of two sides of the first support plate is provided with a first rotating shaft, and the first rotating shaft is inserted into a corresponding first rotating shaft groove, so that an end of the first support plate is rotatably connected to the third rear shell, each of two sides of the second support plate is provided with a second rotating shaft, and the second rotating shaft is inserted into a corresponding second rotating shaft groove, so that an end of the second support plate is rotatably connected to the third rear shell.

In an embodiment of the present invention, the display device further comprises a display screen. The display screen is disposed on a side of the support plate away from the rear shell, the display screen comprises a bending area and a non-bending area, the display screen located in the bending area is disposed opposite to the support plate and is not fixed with the support plate.

In an embodiment of the present invention, after the display screen is bent, the display screen in the bending area is in a shape of a water drop.

In an embodiment of the present invention, material of the support plate comprises one or more of aluminum alloy, iron-nickel alloy, stainless steel, and amorphous material.

An embodiment of the present invention further provides a display device comprising a rear shell. The rear shell comprises a first rear shell; a second rear shell; a third rear shell, wherein two ends of the third rear shell are respectively rotatably connected to the first rear shell and the second rear shell; a support plate comprising a first support plate, wherein the first support plate is disposed on the first rear shell, an end of the first support plate is rotatably connected to the third rear shell, and another end of the first support plate is slidingly connected to the first rear shell; a second support plate, wherein the second support plate is disposed on the second rear shell, an end of the second support plate is rotatably connected to the third rear shell, and another end of the second support plate is slidingly connected to the second rear shell.

In an embodiment of the present invention, the display device further comprises a plurality of rotating shafts. The first rear shell comprises a first bottom surface and two first side surfaces respectively connected to the first bottom surface, the two first side surfaces are oppositely arranged, and each of the first side surfaces is provided with a first through hole. The second rear shell comprises a second bottom surface and two second side surfaces respectively connected to the second bottom surface, the two second side surfaces are oppositely arranged, and each of the second side surfaces is provided with a second through hole. The third rear shell comprises a third bottom surface and two third side surfaces respectively connected to the third bottom surface, the two third side surfaces are oppositely arranged, an end of each of the third side surfaces is provided with a third through hole, another end of each of the third sides is provided with a fourth through hole. The first through hole and the third through hole are fixed together by a corresponding rotating shaft, and the second through hole and the fourth through hole are fixed together by a corresponding rotating shaft.

In an embodiment of the present invention, each first side of the first rear shell is provided with a first chute, each second side of the second rear shell is provided with a second chute, each of two sides of the first support plate is provided with a first slider, and the first slider is inserted in a corresponding first chute, so that an end of the first support plate is slidingly connected to the first rear shell, each of two sides of the second support plate is provided with a second slider, and the second slider is inserted in a corresponding second chute, so that an end of the second support plate is slidingly connected to the second rear shell.

In an embodiment of the present invention, the first chute and the second chute are both linear chutes, or the first chute and the second chute are both arc-shaped chutes.

In an embodiment of the present invention, each third side of the third rear shell is provided with a first rotating shaft groove and a second rotating shaft groove, each of two sides of the first support plate is provided with a first rotating shaft, and the first rotating shaft is inserted into a corresponding first rotating shaft groove, so that an end of the first support plate is rotatably connected to the third rear shell, each of two sides of the second support plate is provided with a second rotating shaft, and the second rotating shaft is inserted into a corresponding second rotating shaft groove, so that an end of the second support plate is rotatably connected to the third rear shell.

In an embodiment of the present invention, when the first rear shell, the second rear shell, and the third rear shell are on a same horizontal plane, the first rear shell and the second rear shell completely house the third rear shell.

In an embodiment of the present invention, a corner of a first side of the first rear shell close to the second rear shell is rounded, and a corner of a second side of the second rear shell close to the first rear shell is rounded.

In an embodiment of the present invention, the display device, further comprises a display screen. The display screen is disposed on a side of the support plate away from the rear shell, the display screen comprises a bending area and a non-bending area, the display screen located in the bending area is disposed opposite to the support plate and is not fixed with the support plate.

In an embodiment of the present invention, after the display screen is bent, the display screen in the bending area is in a shape of a water drop.

In an embodiment of the present invention, material of the support plate comprises one or more of aluminum alloy, iron-nickel alloy, stainless steel, and amorphous material.

Beneficial effect:

In the display device of embodiments of the present invention, the support plate is rotatably connected to the third rear shell, and the support plate is slidingly connected to the first rear shell and the second rear shell respectively. This allows the display device to form a folded structure, which improves portability of the display device.

DESCRIPTION OF DRAWINGS

In order to make the above contents of the present invention more obvious and understandable, the preferred embodiments are described in detail below, and in conjunction with the attached drawings, detailed descriptions are as follows.

DETAILED DESCRIPTION OF PREFERRED EMBODIMENTS

Figure 1:
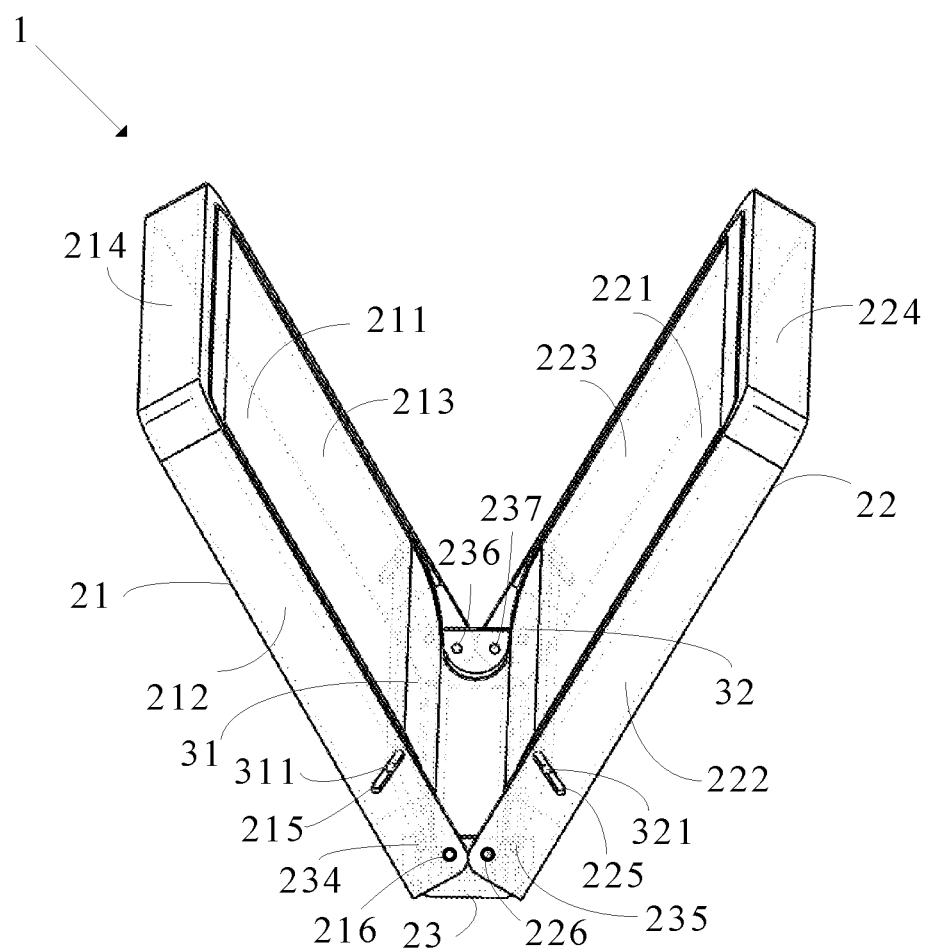
FIG. 1 is a first schematic structural diagram of a display device provided by an embodiment of the present invention.

The following descriptions of the embodiments refer to the attached drawings to illustrate specific embodiments of the present invention that can be implemented. Directional terms mentioned in the present invention, such as "up", "down", "front", "rear", "left", "right", "inner", "outer", "side", etc., just refer to the directions of the attached drawings. Therefore, the directional terminology is used to illustrate and understand the present invention, not to limit the present invention.

In the figure, units with similar structures are indicated by the same reference numerals.

Reference herein to "embodiments" means that specific features, structures, or characteristics described in connection with the embodiments may be included in at least one embodiment of the present invention. The appearance of the phrase in various places in the specification does not necessarily refer to the same embodiment, nor is it an independent or alternative embodiment mutually exclusive of other embodiments. Those skilled in the art understand explicitly and implicitly that the embodiments described herein can be combined with other embodiments.

An embodiment of the present invention provides a display device. As shown in FIG. 1, FIG. 1 is a schematic structural diagram of a display device provided by an embodiment of the present invention. The display device 1 includes a rear shell 2 and a support plate 3.

The rear shell 2 includes a first rear shell 21, a second rear shell 22, and a third rear shell 23. Two ends of the third rear shell 23 are rotatably connected to the first rear shell 21 and the second rear shell 22, respectively.

As shown in FIG. 1, the first rear shell 21 includes a first bottom surface 211 and two first side surfaces 212 and 213 respectively connected to the first bottom surface 211. In an embodiment, the first rear shell 2 further includes a side surface 214. The first side surface 212 and the first side surface 213 are oppositely arranged. The side surface 214 connects not only the first side surface 212 and the first side surface 213 but also the first bottom surface 211. The side surface 214, the first side surface 212, and the first side surface 213 form a three-sided surrounding structure of the first rear shell 21. The first side surfaces 212 and 213 are each provided with a first chute 215. The first chute 215 may be a linear chute or an arc-shaped chute, which is specifically set according to a folding angle of the display device 1. It should be noted that the first chute 215 can be replaced with a sliding rail or similar sliding mechanism. The first side surfaces 212 and 213 are each provided with a first through hole 216.

As shown in FIG. 1, the second rear shell 22 includes a second bottom surface 221 and two second side surfaces 222 and 223 respectively connected to the first bottom surface 221. In an embodiment, the second rear shell 22 further includes a side surface 224. The second side surfaces 222 and 223 are oppositely arranged. The side surface 224 is not only connected to the second side surfaces 222 and 223 but also connected to the second bottom surface 221. A second chute 225 is also provided on the second side surfaces 222 and 223 respectively. The second chute 225 may be a linear chute or an arc-shaped chute, which is specifically set according to a folding angle of the display device 1. In order to allow the first rear shell 21 and the second rear shell 22 to rotate at an equal angle, the first chute 215 and the second chute 225 may be provided as chutes of the same shape. It should be noted that the second chute 225 can be replaced by a sliding mechanism such as a sliding rail. The second side surfaces 222 and 223 are each provided with a second through hole 226.

The third rear shell 23 includes a third bottom surface 231 and third side surfaces 232 and 233 connected to the third bottom surface 231 respectively. The third side surfaces 232 and 233 are oppositely arranged. Each of the third side surfaces 232 and 233 is provided with a first rotating shaft groove 234 and a second rotating shaft groove 235. The third side surface 232 and the side surface 233 are each provided with a third through hole 236 and a fourth through hole 237. The third through hole 236 and the first through hole 216 are dimensionally matched. The fourth through hole 237 and the second through hole 226 are dimensionally matched.

In an embodiment, the display device 1 further includes a plurality of rotating shafts. The first through hole 216 and a corresponding third through hole 236 are fixed together by a corresponding rotating shaft. The second through hole 226 and a corresponding fourth through hole 237 are fixed together by a corresponding rotating shaft.

When the first rear shell 21, the second rear shell 22, and the third rear shell 23 are at a same horizontal plane, the first rear shell 21 and the second rear shell 22 completely house the third rear shell 23.

Figure 2:
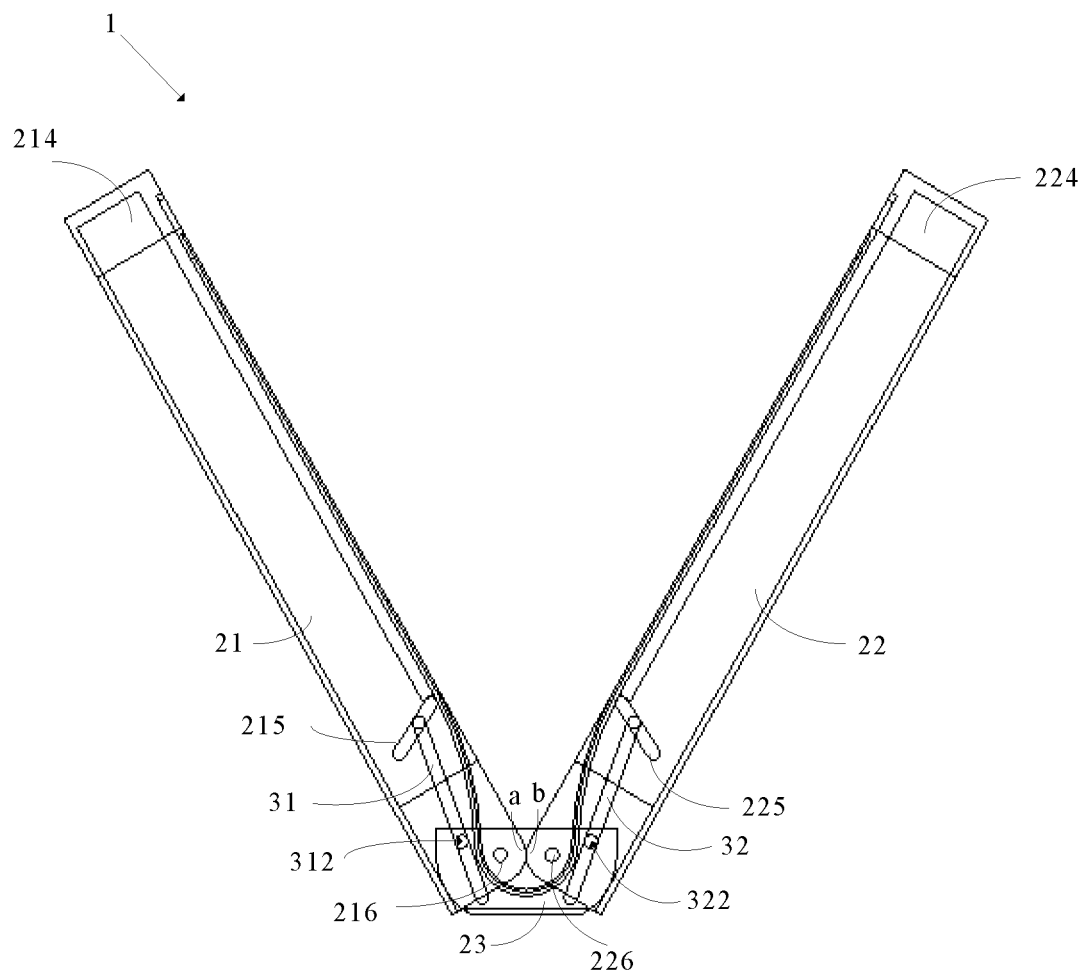
FIG. 2 is a second schematic structural diagram of a display device provided by an embodiment of the present invention.

As shown in FIG. 2, a corner a of the first side surfaces 212 and 213 of the first rear shell 21 close to the second rear shell 22 is rounded. A corner b of the second side surfaces 222 and 223 of the second rear shell 22 close to the first rear shell 21 is rounded. This arrangement can prevent the first rear shell 21 and the second rear shell 22 from coming into contact with each other.

The support plate 3 plays a supporting role, and its constituent materials may use one or more of the following materials with high hardness and light weight: aluminum alloy, iron-nickel alloy, stainless steel, and amorphous material.

Figure 3:
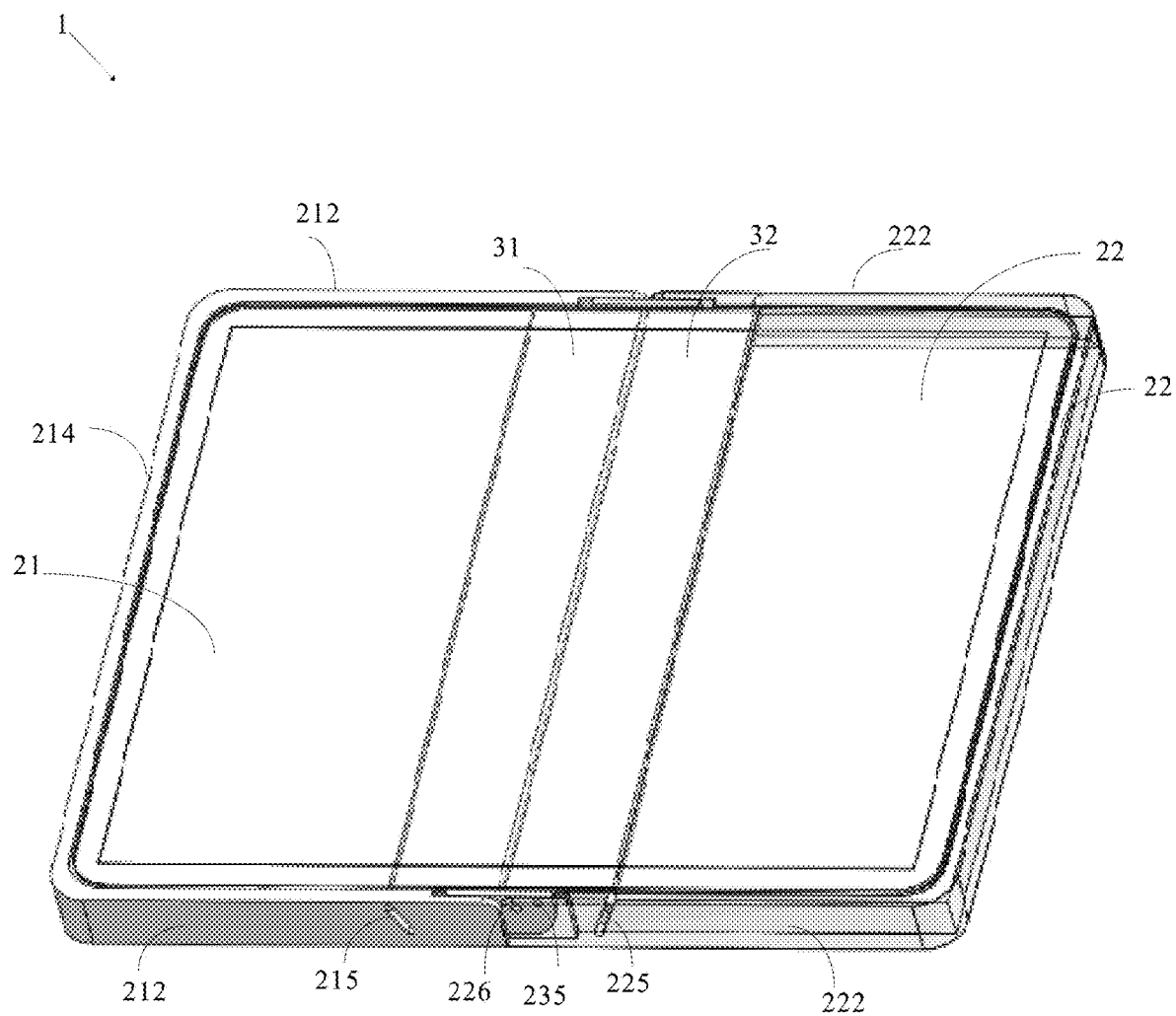
FIG. 3 is a third schematic structural diagram of a display device provided by an embodiment of the present invention.

As shown in FIG. 1 to FIG. 3, the support plate 3 includes a first support plate 31 and a second support plate 32. The first support plate 31 is provided on the first rear shell 21. An end of the first support plate 31 is rotatably connected to the third rear shell 23, and another end of the first support plate 31 is slidingly connected to the first rear shell 21.

Referring to FIG. 1 and FIG. 2, a first slider 311 is provided on each side of the first support plate 31. The first slider 31 is inserted into a corresponding first chute 215, so that an end of the first support plate 31 is slidingly connected to the first rear shell 21. A first rotating shaft 312 is provided on each side of the first support plate 31. The first rotating shaft 312 is inserted into a corresponding first rotating shaft groove 234 so that an end of the first support plate 31 is rotatably connected to the third rear shell 23.

A second slider 321 is provided on each side of the second support plate 32. The second slider 321 is inserted into a corresponding second chute 225, so that an end of the second support plate 32 is slidingly connected to the second rear shell 22. A second rotating shaft 322 is provided on each side of the second support plate 32. The second rotating shaft 322 is inserted into a corresponding second rotating shaft groove 235 so that an end of the second support plate 32 is rotatably connected to the third rear shell 23.

Figure 4:
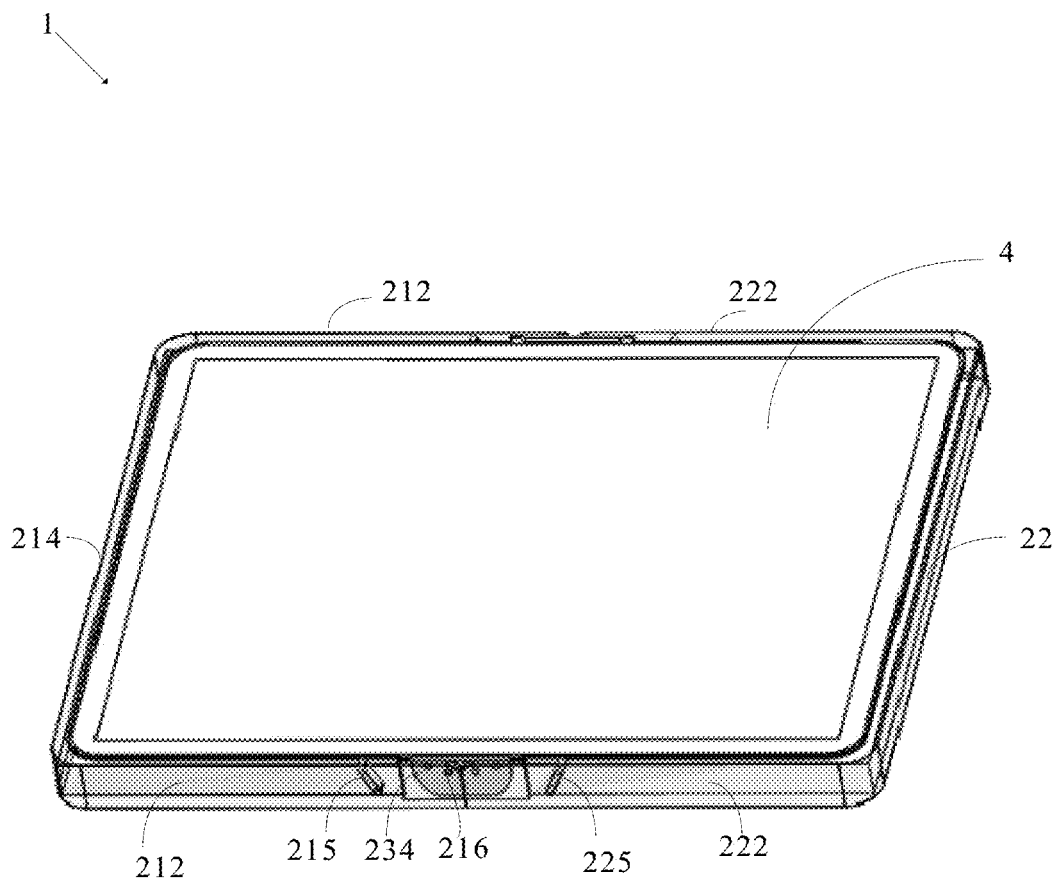
FIG. 4 is a fourth schematic structural diagram of a display device provided by an embodiment of the present invention.
Figure 5:
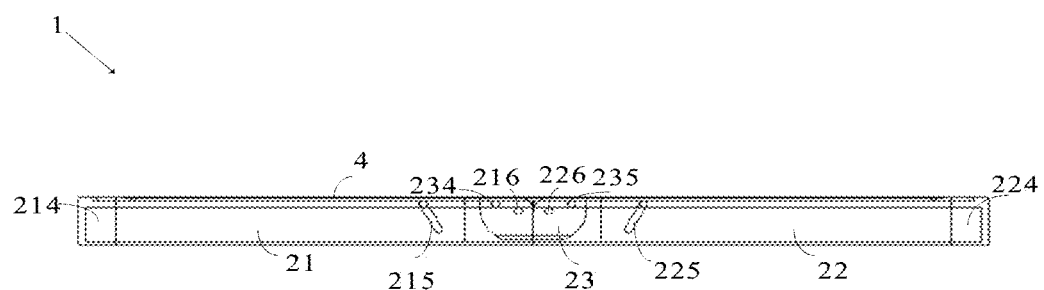
FIG. 5 is a fifth schematic structural diagram of a display device provided by an embodiment of the present invention.

In an embodiment, as shown in FIG. 4 and FIG. 5, the display device 1 further includes a display screen 4. The display screen 4 is disposed on a side of the support plate 3 away from the rear shell 2. The display screen 4 includes a bending area and a non-bending area. The display screen located in the bending area is opposite to the support plate 3 and is not fixed with the support plate 3.

A process of the rear shell 2, the support plate 3, and the display screen 4 cooperating with each other during a bending process of the display device 1 will be described in detail below.

As shown in FIG. 3 and FIG. 5, the display device 1 is in a flat state, and at this time, the support plate 3 can be used to support the display screen 4 provided thereon. The first slider 311 is at the top of the first chute 215, and the second slider 321 is at the top of the second chute 225.

The first rear shell 21 and the second rear shell 22 completely house the third rear shell 23, so that there is only one gap on the back of the display device 1, and only the gap can be treated to prevent invasion of water and oxygen.

As shown in FIG. 2, the display device 1 is in a folded state. During a folding process from FIGS. 3-5 to FIG. 2, the rotating shaft inserted through the first through hole 216 and the third through hole 236 drives the first rear shell 21 to rotate toward the second rear shell 22. The rotating shaft inserted through the second through hole 226 and the fourth through hole 237 drives the second rear shell 22 to rotate toward 21. That is, the first rear shell 21 and the second rear shell 22 are close to each other.

The first slider 311 slides along the top of the first chute 215 to the bottom. The first rotating shaft 312 inserted in the first rotating shaft groove 234 rotates. The first slider 311 and the first rotating shaft 312 cooperate with each other to slide the first support plate 31 to the outside. Similarly, the second slider 321 slides along the top of the second chute 225 toward the bottom. The second rotating shaft 322 inserted in the second rotating shaft groove 235 rotates. The second slider 321 and the second rotating shaft 322 cooperate with each other, so that the second support plate 32 also slides outward. As shown in FIG. 2, an accommodating space with an upward opening larger than a downward opening is formed between the first support plate 31 and the second support plate 32. The above-mentioned accommodating space is large enough, so that the display screen 4 in the bending area can form a water drop shape, and the display screen 4 is prevented from being damaged during the bending process.

In the display device of embodiments of the present invention, the support plate is rotatably connected to the third rear shell, and the support plate is slidingly connected to the first rear shell and the second rear shell respectively. This allows the display device to form a folded structure, which improves portability of the display device. Further, during the bending process, the first support plate and the second support plate move outward, which can give the display screen enough bending space and improve a bending performance of the display screen.

In summary, although the present invention has been disclosed as the preferred embodiments above, the above preferred embodiments are not intended to limit the present invention. Those of ordinary skill in the art can make various changes and modifications without departing from the spirit and scope of the present invention. Therefore, the protection scope of the present invention is subject to the scope defined by the claims.

What is claimed is:

1. A display device, comprising: a plurality of rotating shafts;
a rear shell comprising:
a first rear shell, wherein each first side of the first rear shell is provided with a first chute;
a second rear shell, wherein each second side of the second rear shell is provided with a second chute;
a third rear shell, wherein two ends of the third rear shell are respectively rotatably connected to the first rear shell and the second rear shell;
a first support plate, wherein the first support plate is disposed on the first rear shell, an end of the first support plate is rotatably connected to the third rear shell, and another end of the first support plate is slidingly connected to the first rear shell, each of two sides of the first support plate is provided with a first slider;
a second support plate, wherein the second support plate is disposed on the second rear shell, an end of the second support plate is rotatably connected to the third rear shell, and another end of the second support plate is slidingly connected to the second rear shell, each of two sides of the second support plate is provided with a second slider; and
a display screen, wherein the display screen comprises a bending area and a non-bending area;
wherein when the first rear shell, the second rear shell, and the third rear shell are on a same horizontal plane, the first rear shell and the second rear shell house the third rear shell;
wherein a corner of a first side of the first rear shell close to the second rear shell is rounded, and a corner of a second side of the second rear shell close to the first rear shell is rounded;
wherein an accommodating space with an upward opening larger than a downward opening is formed between the first support plate and the second support plate, such that the display screen in the bending area forms a water drop shape;
wherein the first rear shell comprises a first bottom surface and two first side surfaces respectively connected to the first bottom surface, the two first side surfaces are oppositely arranged, and each of the first side surfaces is provided with a first through hole;
wherein the second rear shell comprises a second bottom surface and two second side surfaces respectively connected to the second bottom surface, the two second side surfaces are oppositely arranged, and each of the second side surfaces is provided with a second through hole; wherein the third rear shell comprises a third bottom surface and two third side surfaces respectively connected to the third bottom surface, the two third side surfaces are oppositely arranged, an end of each of the third side surfaces is provided with a third through hole, another end of each of the third sides is provided with a fourth through hole;
wherein when the display device is in a flat state, the first support plate and the second support plate support the display screen, the first slider is at a top of the first chute, and the second slider is at a top of the second chute, the first rear shell and the second rear shell completely house the third rear shell, so that there is only one gap on a back of the display device; when the display device is in a folded state, the rotating shaft inserted through the first through hole and the third through hole drives the first rear shell to rotate toward the second rear shell, and the rotating shaft inserted through the second through hole and the fourth through hole drives the second rear shell to rotate toward the first rear shell.

2. The display device according to claim 1, wherein:
wherein the first through hole and the third through hole are fixed together by a corresponding rotating shaft, and the second through hole and the fourth through hole are fixed together by a corresponding rotating shaft.

3. The display device according to claim 2, wherein:
the first slider is inserted in a corresponding first chute, so that an end of the first support plate is slidingly connected to the first rear shell;
the second slider is inserted in a corresponding second chute, so that an end of the second support plate is slidingly connected to the second rear shell.

4. The display device according to claim 3, wherein the first chute and the second chute are both linear chutes, or the first chute and the second chute are both arc-shaped chutes.

5. The display device according to claim 2, wherein:
each third side of the third rear shell is provided with a first rotating shaft groove and a second rotating shaft groove;
each of two sides of the first support plate is provided with a first rotating shaft, and the first rotating shaft is inserted into a corresponding first rotating shaft groove, so that an end of the first support plate is rotatably connected to the third rear shell;
each of two sides of the second support plate is provided with a second rotating shaft, and the second rotating shaft is inserted into a corresponding second rotating shaft groove, so that an end of the second support plate is rotatably connected to the third rear shell.

6. The display device according to claim 1, wherein material of the first support plate comprises one or more of aluminum alloy, iron-nickel alloy, stainless steel, and amorphous material.

7. A display device, comprising:
a plurality of rotating shafts;
a rear shell comprising:
a first rear shell, wherein each first side of the first rear shell is provided with a first chute;
a second rear shell, wherein each second side of the second rear shell is provided with a second chute;
a third rear shell, wherein two ends of the third rear shell are respectively rotatably connected to the first rear shell and the second rear shell;
a first support plate, wherein the first support plate is disposed on the first rear shell, an end of the first support plate is rotatably connected to the third rear shell, and another end of the first support plate is slidingly connected to the first rear shell, each of two sides of the first support plate is provided with a first slider;
a second support plate, wherein the second support plate is disposed on the second rear shell, an end of the second support plate is rotatably connected to the third rear shell, and another end of the second support plate is slidingly connected to the second rear shell, each of two sides of the second support plate is provided with a second slider; and a display screen, wherein the display screen comprises a bending area and a non-bending area;

wherein an accommodating space with an upward opening larger than a downward opening is formed between the first support plate and the second support plate, such that the display screen in the bending area forms a water drop shape;

wherein the first rear shell comprises a first bottom surface and two first side surfaces respectively connected to the first bottom surface, the two first side surfaces are oppositely arranged, and each of the first side surfaces is provided with a first through hole; wherein the second rear shell comprises a second bottom surface and two second side surfaces respectively connected to the second bottom surface, the two second side surfaces are oppositely arranged, and each of the second side surfaces is provided with a second through hole; wherein the third rear shell comprises a third bottom surface and two third side surfaces respectively connected to the third bottom surface, the two third side surfaces are oppositely arranged, an end of each of the third side surfaces is provided with a third through hole, another end of each of the third sides is provided with a fourth through hole;

wherein when the display device is in a flat state, the first support plate and the second support plate support the display screen, the first slider is at a top of the first chute, and the second slider is at a top of the second chute, the first rear shell and the second rear shell completely house the third rear shell, so that there is only one gap on a back of the display device; when the display device is in a folded state, the rotating shaft inserted through the first through hole and the third through hole drives the first rear shell to rotate toward the second rear shell, and the rotating shaft inserted through the second through hole and the fourth through hole drives the second rear shell to rotate toward the first rear shell.

8. The display device according to claim 7, wherein:
wherein the first through hole and the third through hole are fixed together by a corresponding rotating shaft, and the second through hole and the fourth through hole are fixed together by a corresponding rotating shaft.

9. The display device according to claim 8, wherein:
the first slider is inserted in a corresponding first chute, so that an end of the first support plate is slidingly connected to the first rear shell;
the second slider is inserted in a corresponding second chute, so that an end of the second support plate is slidingly connected to the second rear shell.

10. The display device according to claim 9, wherein the first chute and the second chute are both linear chutes, or the first chute and the second chute are both arc-shaped chutes.

11. The display device according to claim 8, wherein:
each third side of the third rear shell is provided with a first rotating shaft groove and a second rotating shaft groove;
each of two sides of the first support plate is provided with a first rotating shaft, and the first rotating shaft is inserted into a corresponding first rotating shaft groove, so that an end of the first support plate is rotatably connected to the third rear shell;
each of two sides of the second support plate is provided with a second rotating shaft, and the second rotating shaft is inserted into a corresponding second rotating shaft groove, so that an end of the second support plate is rotatably connected to the third rear shell.

12. The display device according to claim 7, wherein when the first rear shell, the second rear shell, and the third rear shell are on a same horizontal plane, the first rear shell and the second rear shell completely house the third rear shell.

13. The display device according to claim 7, wherein a corner of a first side of the first rear shell close to the second rear shell is rounded, and a corner of a second side of the second rear shell close to the first rear shell is rounded.

14. The display device according to claim 7, wherein material of the first support plate comprises one or more of aluminum alloy, iron-nickel alloy, stainless steel, and amorphous material.

* * * * *